(12) United States Patent
Lu et al.

(10) Patent No.: US 10,867,957 B2
(45) Date of Patent: Dec. 15, 2020

(54) MECHANISMS FOR FORMING HYBRID BONDING STRUCTURES WITH ELONGATED BUMPS

(71) Applicant: Taiwan Semiconductor Manufacturing Co., Ltd., Hsinchu (TW)

(72) Inventors: Chun-Lin Lu, Hsinchu (TW); Kai-Chiang Wu, Hsinchu (TW); Ming-Kai Liu, New Taipei (TW); Yen-Ping Wang, Hemei Township (TW); Shih-Wei Liang, Dajia Township (TW); Ching-Feng Yang, Taipei (TW); Chia-Chun Miao, Taichung (TW); Hung-Jen Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/223,274

(22) Filed: Dec. 18, 2018

(65) Prior Publication Data

US 2019/0123017 A1 Apr. 25, 2019

Related U.S. Application Data

(60) Continuation of application No. 15/419,949, filed on Jan. 30, 2017, now Pat. No. 10,163,846, which is a
(Continued)

(51) Int. Cl.
*H01L 23/00* (2006.01)
*H01L 23/31* (2006.01)

(52) U.S. Cl.
CPC ............ *H01L 24/81* (2013.01); *H01L 24/05* (2013.01); *H01L 24/11* (2013.01); *H01L 24/13* (2013.01); *H01L 24/14* (2013.01); *H01L 24/16* (2013.01); *H01L 24/17* (2013.01); *H01L 23/3192* (2013.01); *H01L 2224/0345* (2013.01); *H01L 2224/03462* (2013.01);
(Continued)

(58) Field of Classification Search
CPC . H01L 2924/01079; H01L 2924/01078; H01L 2924/01013; H01L 2224/13099; H01L 2924/01029; H01L 24/11; H01L 2924/14
USPC ........................................ 257/737; 438/613
See application file for complete search history.

(56) References Cited

U.S. PATENT DOCUMENTS 5,475,236 A 12/1995 Yoshizaki
5,633,535 A 5/1997 Chao et al.
(Continued)

*Primary Examiner* — Didarul A Mazumder
(74) *Attorney, Agent, or Firm* — Slater Matsil, LLP

(57) ABSTRACT

Embodiments of mechanisms for forming a package structure are provided. The package structure includes a semiconductor die and a substrate. The package structure includes a pillar bump and an elongated solder bump bonded to the semiconductor die and the substrate. A height of the elongated solder bump is substantially equal to a height of the pillar bump. The elongated solder bump has a first width, at a first horizontal plane passing through an upper end of a sidewall surface of the elongated solder bump, and a second width, at a second horizontal plane passing through a midpoint of the sidewall surface. A ratio of the second width to the first width is in a range from about 0.5 to about 1.1.

20 Claims, 11 Drawing Sheets

Related U.S. Application Data division of application No. 13/927,972, filed on Jun. 26, 2013, now Pat. No. 9,559,071.

(52) U.S. Cl.
CPC ............ *H01L 2224/03472* (2013.01); *H01L 2224/03828* (2013.01); *H01L 2224/0401* (2013.01); *H01L 2224/05027* (2013.01); *H01L 2224/0554* (2013.01); *H01L 2224/05559* (2013.01); *H01L 2224/05568* (2013.01); *H01L 2224/05573* (2013.01); *H01L 2224/05644* (2013.01); *H01L 2224/05647* (2013.01); *H01L 2224/05655* (2013.01); *H01L 2224/05666* (2013.01); *H01L 2224/05669* (2013.01); *H01L 2224/10135* (2013.01); *H01L 2224/119* (2013.01); *H01L 2224/11015* (2013.01); *H01L 2224/1132* (2013.01); *H01L 2224/1145* (2013.01); *H01L 2224/1146* (2013.01); *H01L 2224/1147* (2013.01); *H01L 2224/1181* (2013.01); *H01L 2224/11334* (2013.01); *H01L 2224/11849* (2013.01); *H01L 2224/131* (2013.01); *H01L 2224/1308* (2013.01); *H01L 2224/1319* (2013.01); *H01L 2224/13144* (2013.01); *H01L 2224/13147* (2013.01); *H01L 2224/13155* (2013.01); *H01L 2224/13166* (2013.01); *H01L 2224/13169* (2013.01); *H01L 2224/14051* (2013.01); *H01L 2224/14131* (2013.01); *H01L 2224/14135* (2013.01); *H01L 2224/14179* (2013.01); *H01L 2224/14505* (2013.01); *H01L 2224/1601* (2013.01); *H01L 2224/16057* (2013.01); *H01L 2224/16058* (2013.01); *H01L 2224/16238* (2013.01); *H01L 2224/17051* (2013.01); *H01L 2224/17517* (2013.01); *H01L 2224/814* (2013.01); *H01L 2224/81011* (2013.01); *H01L 2224/81024* (2013.01); *H01L 2224/81139* (2013.01); *H01L 2224/81148* (2013.01); *H01L 2224/81191* (2013.01); *H01L 2224/81193* (2013.01); *H01L 2224/81815* (2013.01); *H01L 2924/1305* (2013.01); *H01L 2924/13091* (2013.01); *H01L 2924/351* (2013.01)

(56) References Cited

U.S. PATENT DOCUMENTS

| | | | |
|---|---|---|---|
| 5,914,536 A * | 6/1999 | Shizuki | H01L 24/13 257/778 |
| 6,016,013 A | 1/2000 | Baba | |
| 2002/0086515 A1 | 7/2002 | Fukuyama | |
| 2007/0052109 A1 | 3/2007 | Chen et al. | |
| 2007/0166993 A1 | 7/2007 | Lee et al. | |
| 2008/0067677 A1 * | 3/2008 | Lin | H01L 24/06 257/738 |
| 2008/0227237 A1 | 9/2008 | Lin et al. | |
| 2009/0152738 A1 * | 6/2009 | Sathe | H05K 3/303 257/777 |
| 2009/0197114 A1 | 8/2009 | Shih et al. | |
| 2009/0200663 A1 | 8/2009 | Daubenspeck et al. | |
| 2009/0236756 A1 | 9/2009 | Kim et al. | |
| 2010/0283144 A1 | 11/2010 | Liang | |
| 2011/0133327 A1 * | 6/2011 | Hsu | H01L 21/563 257/692 |
| 2011/0215466 A1 | 9/2011 | Hsu et al. | |
| 2011/0248398 A1 | 10/2011 | Parvarandeh et al. | |
| 2012/0168948 A1 | 7/2012 | Rathburn | |
| 2012/0261662 A1 | 10/2012 | Liang et al. | |
| 2012/0273934 A1 * | 11/2012 | Shieh | H01L 23/49838 257/737 |
| 2013/0068514 A1 | 3/2013 | Hsu | |
| 2013/0087915 A1 * | 4/2013 | Warren | H01L 24/05 257/738 |
| 2013/0099371 A1 * | 4/2013 | Cheng | H01L 24/13 257/737 |
| 2013/0221074 A1 | 8/2013 | Wei et al. | |
| 2013/0221536 A1 | 8/2013 | Gregorich et al. | |
| 2013/0228916 A1 * | 9/2013 | Mawatari | H01L 24/81 257/737 |
| 2013/0285238 A1 | 10/2013 | Chen et al. | |

* cited by examiner

MECHANISMS FOR FORMING HYBRID BONDING STRUCTURES WITH ELONGATED BUMPS

This application is a continuation application of, and claims the benefit of, U.S. application Ser. No. 15/419,949, filed Jan. 30, 2017, entitled "Mechanisms for Forming Hybrid Bonding Structures with Elongated Bumps," now U.S. Pat. No. 10,163,846, which is a divisional application of, and claims the benefit of, U.S. application Ser. No. 13/927,972, filed Jun. 26, 2013, entitled "Mechanisms for Forming Hybrid Bonding Structures with Elongated Bumps," now U.S. Pat. No. 9,559,071, which applications are incorporated herein by reference

BACKGROUND

The fabrication of modern integrated circuits (ICs) involves several process steps. Integrated circuits are first fabricated on/in a semiconductor wafer. The semiconductor wafer contains multiple duplicated semiconductor chips, each including integrated circuits. The semiconductor chips are then sawed from the semiconductor wafer and packaged. The packaging process has two main purposes: to protect delicate semiconductor chips, and to connect interior integrated circuits to exterior connections.

As semiconductor devices reach higher levels of integration, the packaging of a semiconductor chip accounts for a considerable portion of the cost of producing the device. Failure of the package leads to costly yield reduction.

There are challenges in fabricating reliable package structures.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
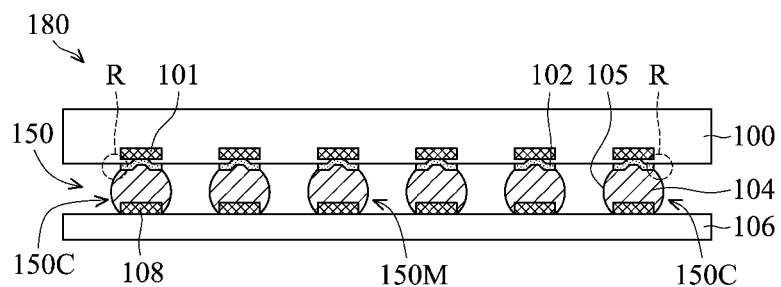
FIG. 1A shows a cross-sectional view of a package structure, in accordance with some embodiments.

FIG. 1A is a cross-sectional view of a package structure 180 formed by bonding a semiconductor die 100 and a substrate 106, in accordance with some embodiments. Semiconductor die 100 is flipped upside down and attached to a substrate 106 through bonding structures 150. In some embodiments, semiconductor die 100 is made of an elementary semiconductor material including silicon or germanium in a single crystal, polycrystal, or amorphous structure. In some other embodiments, semiconductor die 100 is made of a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, and/or combinations thereof. In some embodiments, semiconductor die 100 includes silicon on insulator ("SOI"). In some embodiments, semiconductor die 100 also includes passive devices such as resistors, capacitors, inductors and the like, or active devices such as transistors. In some embodiments, semiconductor die 100 may include through substrate vias (TSVs).

Semiconductor die 100 may further include isolation features (not shown), such as shallow trench isolation (STI) features or local oxidation of silicon (LOCOS) features. The isolation features may define and isolate various device elements. Examples of the various device elements, that may be formed in semiconductor die 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other suitable elements. Various processes are performed to form the various device elements, such as deposition, etching, implantation, photolithography, annealing, and/or other suitable processes.

Substrate 106 may be made of any applicable type of substrate materials, such as a package substrate, a print circuit board (PCB) substrate, or the materials used for semiconductor die 100. In some embodiments, substrate 106 also includes passive devices, such as resistors, capacitors, inductors and the like, or active devices, such as transistors. In some embodiments, substrate 106 includes additional integrated circuits. Substrate 106 may further include through substrate vias (TSVs) and may be an interposer.

Each of bonding structures 150 includes a pad 101, an under bump metallurgy (UBM) layer 102, a solder bump 104, and a pad 108. UBM layer 102 is formed over pads 101 on semiconductor die 100. Pads 108 are formed over substrate 106. Pads 101 and 108 are conductive and electrically connected to devices formed in semiconductor die 100 and substrate 106, respectively. Pads 101 and 108 may be made of aluminum, copper, gold, titanium, platinum, another suitable material, alloy thereof, or combinations thereof. In some embodiments, UBM layer 102 includes sub-layers. For example, UBM layer 102 includes a Ti sub-layer and a Cu sub-layer. The Cu sub-layer may serve as a Cu seed layer which is made of Cu or Cu alloy. Solder bumps 104 are formed between UBM layer 102 and pads 108. Solder bumps 104 may include lead or lead free materials.

In some embodiments, bonding structures 150 include structures 150M, which are away from corners of semiconductor die 100, and corner structures 150C. After a thermal cycling of bonding processes, high stress is generated on corner structures 150C due to mismatch of CTE (coefficients of thermal expansion) between semiconductor die 100 and substrate 106. For example, the high stress may concentrate at regions R of corner structures 150C. Such high stress could result in bump cracking and reduce the yield of package structure 180.

Figure 1B:
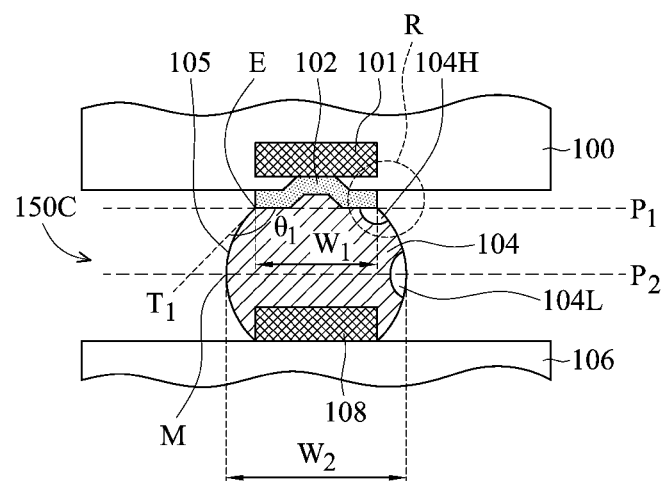
FIG. 1B shows an enlarged cross-sectional view of a portion of the package structure shown in FIG. 1A, in accordance with some embodiments.

FIG. 1B is an enlarged cross-sectional view of a portion of package structure 180 shown in FIG. 1A, in accordance with some embodiments. Solder bump 104 has a sidewall surface 105 curved outwardly. Solder bump 104 has a width $W_1$ at a horizontal plane $P_1$ passing through an upper end E of sidewall surface 105. In addition, solder bump 104 has a second width $W_2$ at a horizontal plane $P_2$ passing through a midpoint M of sidewall surface 105. A ratio of width $W_2$ to width $W_1$ is in a range from about 1.1 to about 1.4. An angle $\theta_1$ between horizontal plane $P_1$ passing through upper end E and a tangent line $T_1$ of sidewall surface 105 passing through upper end E may be in a range from about 110 degrees to about 140 degrees.

As mentioned above, region R of corner structure 150C, near an interface between a corner solder bump 104 and UBM layer 102, suffers from high stress. According to a stress simulation, portion 104H of solder bump 104 in region R (see FIG. 1A) suffers from the highest stress after a thermal cycling. In contrast, portion 104L of solder bumps 104 at the widest portion of solder bump 104 has less stress than portion 104H. The highly concentrated stress at portion 104H of solder bump 104 could result in bump cracking near or at interface between solder bump 104 and UBM layer 102.

Simulation result shows that the stress in elongated solder bumps is redistributed. Therefore, the corner regions of the elongated solder bumps suffer from less stress than regular solder bumps 104. Therefore, it is desirable to form bonding structures with elongated solder bumps to reduce high stress in corner regions.

Figure 2A:
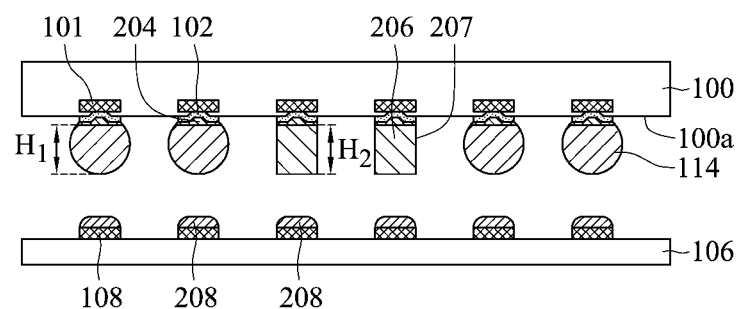
FIGS. 2A-2B are cross-sectional views before and after a package structure is formed, in accordance with some embodiments.
Figure 2B:
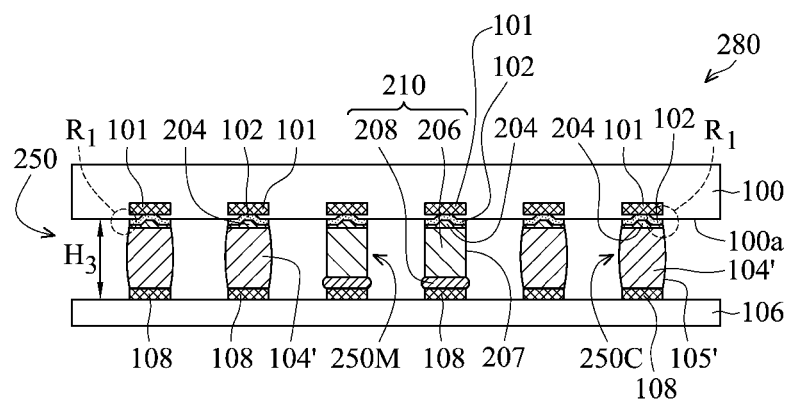

FIGS. 2A-2B are cross-sectional views before and after a package structure 280 IA formed, in accordance with some embodiments. FIG. 2A shows semiconductor die 100 and substrate 106 before they are bonded, in accordance with some embodiments. Pads 101 and UBM layer 102 have been described above.

In some embodiments, conductive elements 204 are formed on UBM layer 102. Conductive elements 204 are made of a metal material, such as copper (Cu), gold (Au), platinum (Pt), titanium (Ti), nickel (Ni), or combinations thereof, in accordance with some embodiments. Conductive elements 204 may be formed by using an electroplating process, PVD process, another applicable process, or combinations thereof. Each of conductive elements 204 has a substantially flat surface. In some embodiments, conductive elements 204 are conformally deposited on UBM layer 102. In some embodiments, conductive elements 204 are made of solder.

Conductive pillars 206 are formed on some of conductive elements 204. Conductive pillar 206 may be made of a metal material, such as copper (Cu), gold (Au), platinum (Pt), titanium (Ti), nickel (Ni), aluminum (Al) or combinations thereof. Conductive pillars 206 have sidewalls 207 substantially perpendicular to a main surface 100a of semiconductor die 100.

In some embodiments, solder balls 114 are bonded to remaining conductive elements 204 where no conductive pillars 206 are formed. Conductive pillars 206 have a higher melting temperature than that of solder balls 114. Solder balls 114 have a height $H_1$ which is substantially equal to a height $H_2$ of conductive pillars 206. In some embodiments, height $H_2$ of conductive pillars 206 may be in a range from about 130 μm to about 250 μm. In some other embodiments, height $H_2$ of conductive pillars 206 may be in a range from about 150 μm to about 190 μm. A solder layer 208 is provided on pads 108 for bonding with solder balls 114 and conductive pillars 206.

Semiconductor die 100 is positioned over substrate 106 to align solder balls 114 and conductive pillars 206 with solder layer 208 on pads 108, respectively. Afterwards, semiconductor die 100 and substrate 106 are placed against each other with applying a pressure to them. A reflow process is also performed to bond solder balls 114 with solder layer 208 and to bond conductive pillars 206 with solder layer 208, as shown in FIG. 2B. After the reflow process, elongated solder bumps 104' and pillar bumps 210 are obtained. Each of pillar bumps 210 includes conductive pillar 206 and solder layer 208. Semiconductor die 100 and substrate 106 are bonded to each other through elongated solder bumps 104' and pillar bumps 210. In some embodiments, a ratio of the number of elongated solder bumps 104' to the number of pillar bumps 210 is in a range from about 20% to about 75%.

Package structure 280 with hybrid bonding structures 250 is therefore formed. Hybrid bonding structures 250 include structures 250M having pillar bumps 210 and corner structures 250C having elongated solder bumps 104'. Specifically, each of structures 250M includes pad 101, UBM layer 102, conductive element 204, pillar bump 210, solder layer 208, and pad 108. Each of corner structures 250C includes pad 101, UBM layer 102, a conductive element 204, elongated solder bump 104' and a pad 108.

During the reflow for forming elongated solder bump 104' and pillar bumps 210, conductive pillars 206 remain rigid and help to maintain a height $H_3$ between semiconductor die 100 and substrate 106. Therefore, solder balls 114 and solder layer 208 are reflowed between conductive element 204 and pads 108 without being further pressed. As a result, solder bump 104' is elongated. Sidewall surfaces 207 of conductive pillars 206 are still substantially perpendicular to main surface 100a of substrate 100 after forming pillar bumps 210.

In some embodiments, elongated solder bumps 104' only protrude outward slightly after the thermal reflow when compared to solder bumps 104 shown in FIGS. 1A and 1B. Elongated solder bumps 104' have slightly bulged sidewall surfaces 105'. In some embodiments, sidewall surfaces 105' are almost parallel with sidewall surfaces 207 of conductive pillars 206. Height $H_1$ is substantially equal to height $H_2$, which ensures that both solder balls 114 and conductive pillar 206 are in contact with solder layer 208. Since height $H_3$ between semiconductor die 100 and substrate 106 is maintained, pillar bumps 210 and elongated solder bumps 104', which are formed therebetween, thus have substantially the same height.

Regions $R_1$ are near an interface between elongated corner solder bump 104' and conductive element 102. Simulation confirms that less stress are concentrated at regions $R_1$, compared with regions R shown in FIG. 1A. The stress in elongated solder bumps 104' is redistributed after the thermal reflow, and the stress in regions $R_1$ is much reduced. The bump cracking risk is reduced.

Figure 3:
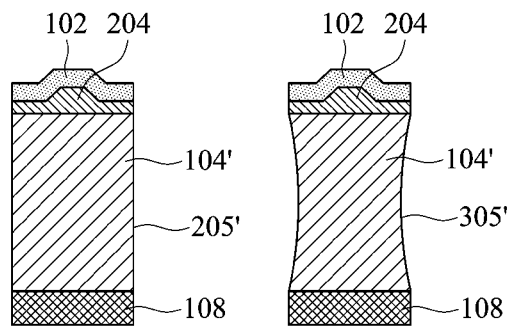
FIG. 3 shows a cross-sectional view of elongated solder bumps, in accordance with some embodiments.

As shown in FIG. 2B, sidewall surfaces 105' of elongated solder bump 104' protrude outward slightly. However, it should be appreciated that embodiments of the disclosure are not limited to the structure shown in FIG. 2B. Elongated solder bumps 104' may have a cross-sectional view with other shapes. For example, elongated solder bumps 104' may have straight sidewall surfaces 205' or contracted sidewall surfaces 305' (i.e., curved inward), as shown in FIG. 3.

Figure 4:
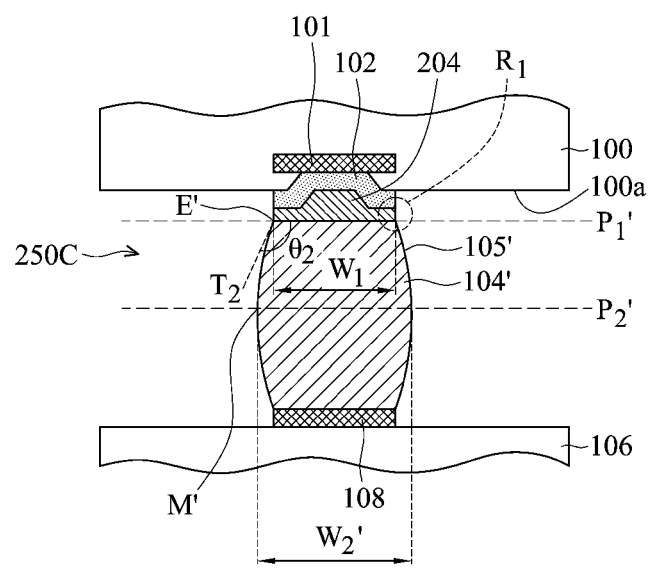
FIG. 4 shows an enlarged cross-sectional view of a portion of the package structure shown in FIG. 2B, in accordance with some embodiments.

FIG. 4 shows an enlarged view of a portion of package structure 280 shown in FIG. 2B, in accordance with some embodiments. Elongated solder bump 104' has a width $W_1$ at a horizontal plane $P_1'$ parallel to main surface 100a and passing through an upper end E' of a sidewall surface 105' of elongated bump 104'. Elongated solder bump 104' has a second width $W_2'$ at a horizontal plane $P_2'$ passing through a midpoint M' of sidewall surface 105'. In some embodiments, a ratio of width $W_2'$ to width $W_1$ is in a range from about 0.5 to about 1.1. In some other embodiments, the ratio of width $W_2'$ to width $W_1$ is in a range from about 0.8 to about 1.1. An angle $\theta_2$ between horizontal plane $P_1'$ passing through upper end E' of sidewall surface 105' and a tangent line $T_2$ of sidewall surface 105' passing through upper end E' is smaller than angle $\theta_1$ as shown in FIG. 1B. For example, angle $\theta_2$ may be in a range from about 60 degrees to about 100 degrees. In some other embodiments, angle $\theta_2$ may be in a range from about 80 degrees to about 95 degrees.

Figure 5A:
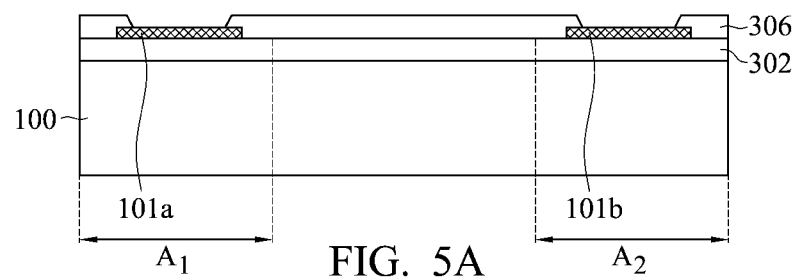
FIGS. 5A-5G are cross-sectional views at various stages of a process for forming a package structure, in accordance with some embodiments.

Embodiments of the disclosure may be formed by using a variety of processes. FIGS. 5A-5G are cross-sectional views at various stages of a process for forming a package structure, in accordance with some embodiments. As shown in FIG. 5A, semiconductor die 100 is provided. Semiconductor die 100 includes a region $A_1$, where an elongated bump will be formed, and a region $A_2$, where a conductive pillar will be formed. Pads 101a and 101b are formed over regions $A_1$ and $A_2$, respectively. Pads 101a and 101b are similar to pads 101. An interconnection structure 302 including dielectric layers and metal layers is formed between semiconductor die 100 and pads 101a and 101b. The metal layers of interconnection structure 302 provide electrical connections between the device elements formed in semiconductor die 100 and pads 101a and 101b.

One or more passivation layers, such as a passivation layer 306, is/are deposited and patterned over interconnection structure 302 and pads 101a and 101b. Passivation layer 306 has openings exposing pads 101a and 101b. In some embodiments, passivation layer 306 is made of a dielectric material, such as a polymer material. The polymer material may be made of polybenzoxazole (PBO), epoxy, polyimide, another suitable material, or combinations thereof. Passivation layer 306 may be deposited by any suitable method, such as a spin-on process, CVD process, another suitable process, or combinations thereof.

Figure 5B:
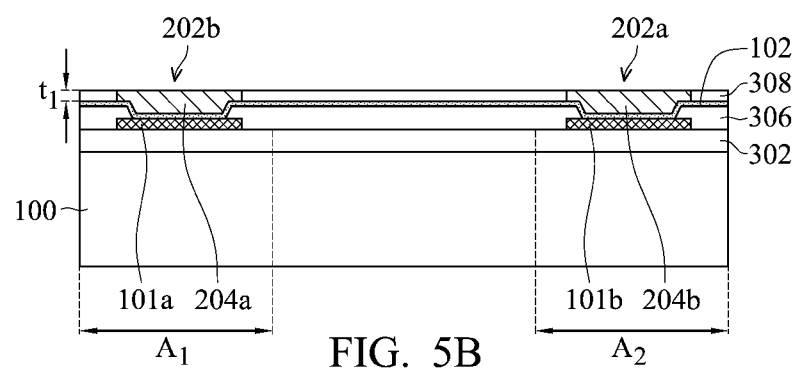

Afterwards, as shown in FIG. 5B, a UBM layer 102 is conformally formed over pads 101a and 10ab and passivation layer 306. UBM layer 102 is described above. Afterwards, a mask layer 308 is deposited and patterned over UBM layer 102. Mask layer 308 has openings exposing UBM layer 102 over pads 101a and 101b. Mask layer 308 may be a photoresist layer. A thickness $t_1$ of mask layer 308 may be in a range from about 7 μm to about 120 μm.

Afterwards, conductive element 204a is formed in the opening of mask layer 308 over region $A_1$ and a conductive element 204b is formed in opening of mask layer 308 over region $A_2$. In some embodiments, conductive elements 204a and 204b may completely fill the openings of mask layer 308. Alternatively, conductive elements 204a and 204b may partially fill openings of mask layer 308. Conductive elements 204a and 204b may be made of a metal material, such as copper (Cu), gold (Au), platinum (Pt), titanium (Ti), nickel (Ni), aluminum (Al), or combinations thereof.

In some embodiments, conductive elements 204a and 204b are directly deposited on the seed layer of UBM layer 102 by plating, such as electroplating. In some other embodiments, conductive element 204a and 204b are formed by other depositing methods, such as PVD. Afterwards, the portions of conductive elements 204a and 204b outside the openings are removed by a CMP process to planarize conductive elements 204a and 204b. Each of conductive elements 204a and 204b has a flat upper surface.

Alternatively, in some embodiments, conductive elements 204a and 204b are conformally deposited on UBM layer 102. Each of conductive elements 204a and 204b has a recessed upper surface. In some other embodiments, conductive elements 204a and 204b are not needed.

Figure 5C:
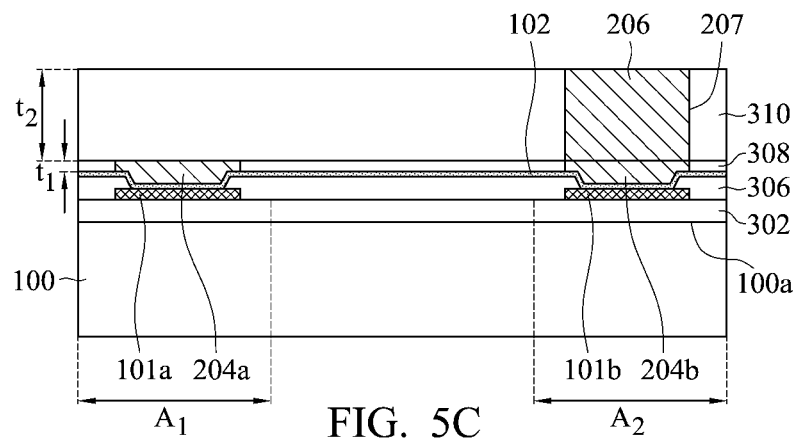

Afterwards, as shown in FIG. 5C, a mask layer 310 is deposited and patterned over mask layer 308. Mask layer 310 has an opening exposing conductive element 204b over region $A_2$. Conductive element 204a is covered by mask layer 310. Mask layer 310 may be a photoresist layer. A thickness $t_2$ of mask layer 310 may be in a range from about 90 μm to about 130 μm. Usually, mask layer 310 is thicker than mask layer 308. In some embodiments, a dry photosensitive film is used as mask layer 310.

Afterwards, conductive pillar 206 is formed over conductive element 204b in the opening of mask layer 310. In some embodiments, conductive pillar 206 is formed on conductive element 204b. In some embodiments, sidewalls surfaces of the opening of mask layer 310 are substantially perpendicular to surface 100a of semiconductor die 100. Therefore, conductive pillar 206 has sidewall surfaces 207 substantially perpendicular to surface 100a of semiconductor die 100. In some other embodiments, pillar 206 is formed by using a plating process, a PVD process, another applicable process, or combinations thereof. In some embodiments, conductive pillar 206 and conductive element 204b are formed of the same material, and conductive element 204b is construed as an extension of conductive pillar 206.

A total thickness ($t_1+t_2$) of mask layers 308 and 310 may be in a range from about 120 μm to about 250 μm. The total thickness of mask layers 308 and 310 may be set to be similar to the desired height of conductive pillar 206.

Therefore, the height of conductive pillar 206 may be adjusted by tuning the total thickness of mask layers 308 and 310.

Figure 5D:
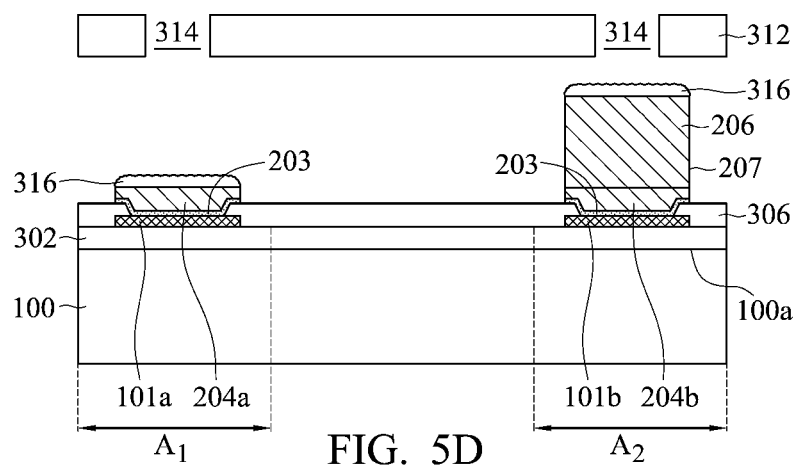

As shown in FIG. 5D, mask layers 310 and 308 are then removed by using a stripping process, in accordance with some embodiments. In addition, exposed portions of UBM layer 102 is removed by using, for example, an etching process.

Following the etching process removing the exposed portions of UBM layer 102, a flux stencil 312 is then provided and positioned above semiconductor die 100, in some embodiments. Flux stencil 312 may have openings 314. Openings 314 are aligned with conductive element 204a in region $A_1$ and conductive pillar 206 in region $A_2$, respectively. Each of openings 314 may have a width which is smaller than that of conductive element 204a or that of conductive pillar 206.

Flux 316 is then applied on conductive element 204a and conductive pillar 206 through openings 314 of flux stencil 312. A flux material may be blanketly applied on flux stencil 312. The flux material penetrates through openings 314 to form flux 316 on surfaces of conductive element 204a and conductive pillar 206. Flux 316 over conductive element 204a and conductive pillar 206 are simultaneously formed. Afterwards, flux stencil 312 is removed.

Figure 5E:
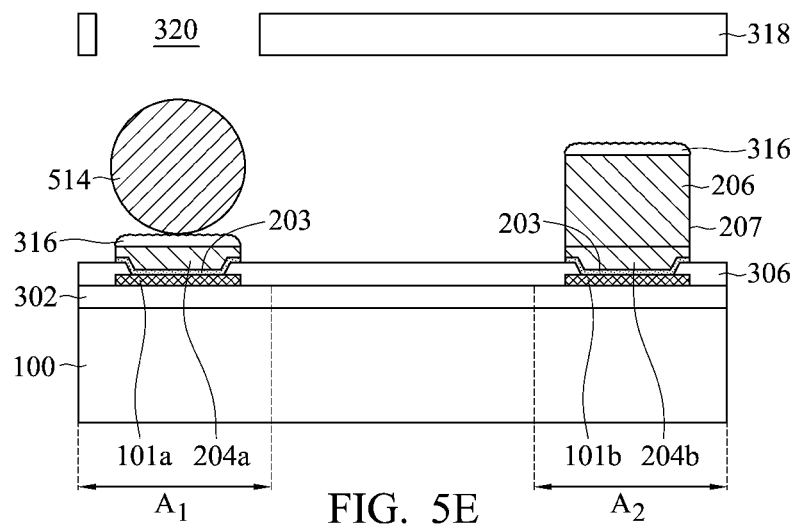

After flux 316 is applied, a bump placing stencil 318 is provided and positioned above semiconductor die 100 to help the alignment of placing solder balls, as shown in FIG. 5E. Bump placing stencil 318 has an opening 320. Opening 320 is aligned with flux 316 over conductive element 204a. Opening 320 has a width larger than that of conductive element 204a.

A solder material ball 514 is placed over conductive element 204a. In some embodiments, solder material ball 514 lands on flux 316, which is on conductive element 204a, through opening 320 of bump placing stencil 318. Solder material ball 514 is secured over conductive element 204a by flux 316. Afterwards, bump placing stencil 318 is removed.

Figure 5F:
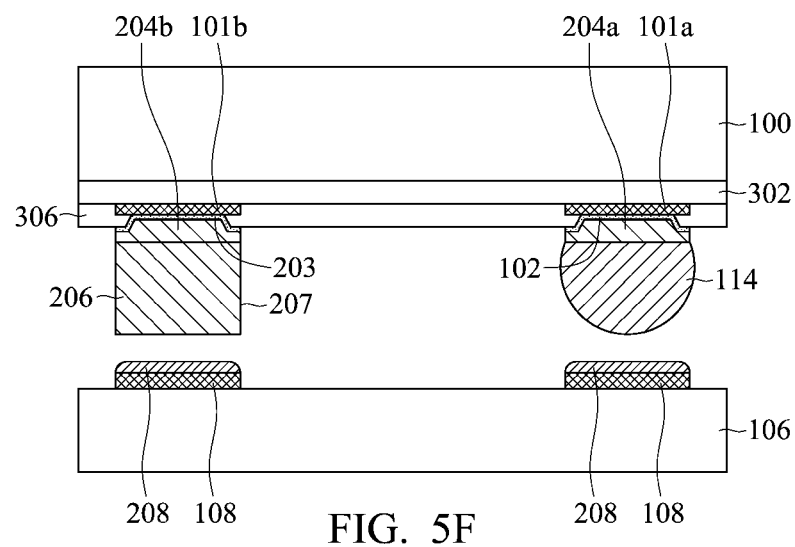

Afterwards, as shown in FIG. 5F, a thermal reflow is performed to bond solder material ball 514 to conductive element 204a to form solder ball 114. Flux 316 evaporates due to the thermal reflow. Substrate 106 is then provided to bond with semiconductor die 100. Pads 108 are formed over substrate 106. Solder layer 208 is applied on pads 108 to bond with solder ball 114 and conductive pillar 206. Semiconductor die 100 is positioned over and aligned with substrate 106 for bonding.

Figure 5G:
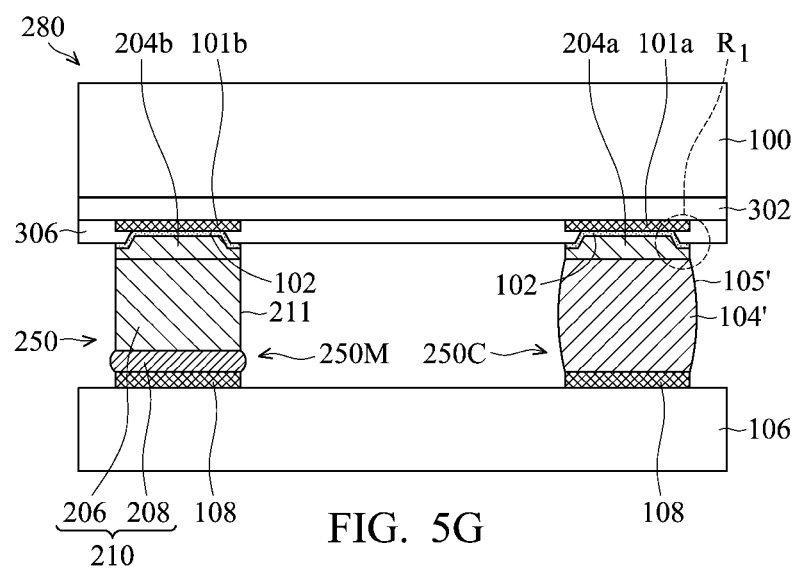

As shown in FIG. 5G, semiconductor die 100 is then bonded with substrate 106 by reflow, in accordance with some embodiments. As mentioned above, the existence of conductive pillar 206 enables the formations of elongated solder bump 104'. In addition, conductive pillar 206 is bonded to solder layer 208 to form pillar bump 210. Package structure 280 with hybrid bonding structures 250 is therefore formed. Hybrid bonding structures 250 include a corner structure 250C having elongated solder bumps 104' and a structure 250M having pillar bump 210. Since the stress is redistributed in elongated solder bump 104', the stress at corner regions $R_1$ is reduced. Elongated solder bump 104' suffers from less stress at corner regions $R_1$, compared with corner regions R of solder bump 104 shown in FIG. 1A. As a result, bump cracking risk is significantly reduced, and yield of package structure 280 is greatly improved.

Figure 6A:
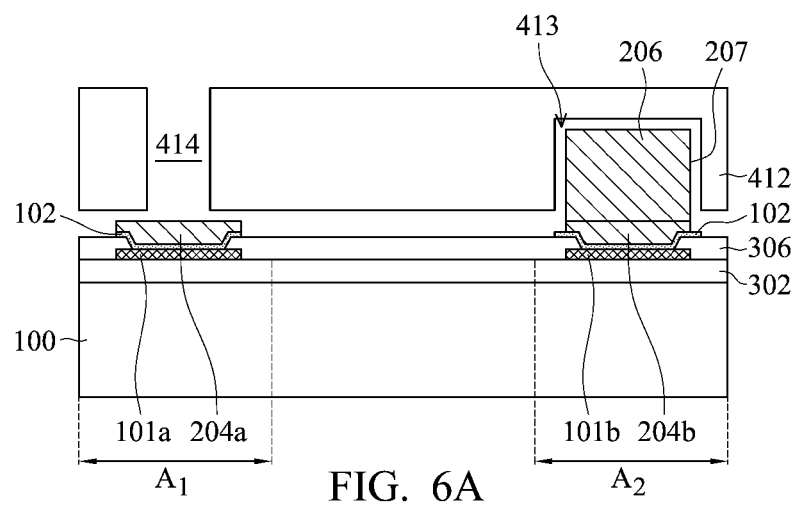
FIGS. 6A-6B are cross-sectional views of applying flux and placing a solder material ball, in accordance with some embodiments.
Figure 6B:
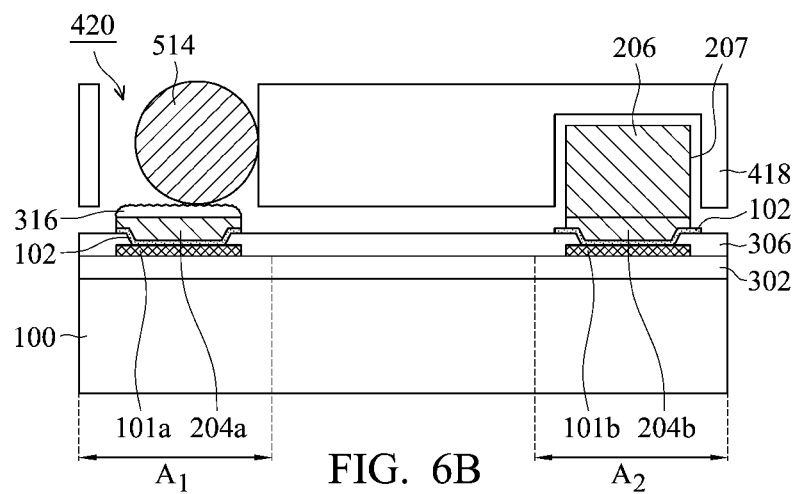

Alternatively, flux 316 and solder material ball 514 are applied on conductive elements 204a and 204b with different stencils. FIGS. 6A-6B are cross-sectional views of applying flux 316 and placing solder material ball 514, in accordance with some embodiments. As shown in FIG. 6A, conductive pillar 206 is formed, and then mask layers 310 and 308 and the exposed UBM layer 102 are removed. Afterwards, a flux stencil 412 is provided and positioned above semiconductor die 100. Flux stencil 412 may have an opening 414 aligned with and exposing conductive element 204a. Opening 414 may have a width smaller than that of conductive element 204a.

Flux stencil 412 also has a cavity 413 aligned with conductive pillar 206. After flux stencil 412 is put on semiconductor die 100, conductive pillar 206 is within cavity 413 and covered by flux stencil 412. Cavity 413 has a width larger than that of conductive pillar 206. Then, flux material is applied on flux stencil 412. The flux material penetrates through opening 414 of flux stencil 412 to reach conductive element 204a. Flux stencil 412 protects conductive pillar 206 from being contacted with the flux material. Afterwards, flux stencil 412 is removed, and the flux material is spread over conductive element 204a to form flux 316, as shown in FIG. 6B.

Afterwards, a bump placing stencil 418 is provided and positioned above semiconductor die 100, as shown in FIG. 6B. Bump placing stencil 418 has an opening 420. Opening 420 is aligned with and exposes flux 316 over conductive element 204a. Opening 420 has a width larger than that of conductive element 204a. Solder material ball 514 is placed on flux 316 through opening 420. Afterwards, bump placing stencil 418 is removed. The process operations described in FIGS. 5F-5G are performed. Afterwards, package structure 280 is formed as shown in FIG. 5G.

Package structure 280 has many hybrid bonding structures 250 including corner structures 250C and structures 250M. FIGS. 7A-7D are top views showing various arrangements of pillar bumps 210 and elongated solder bumps 104' of bonding structures 250.

Figure 7A:
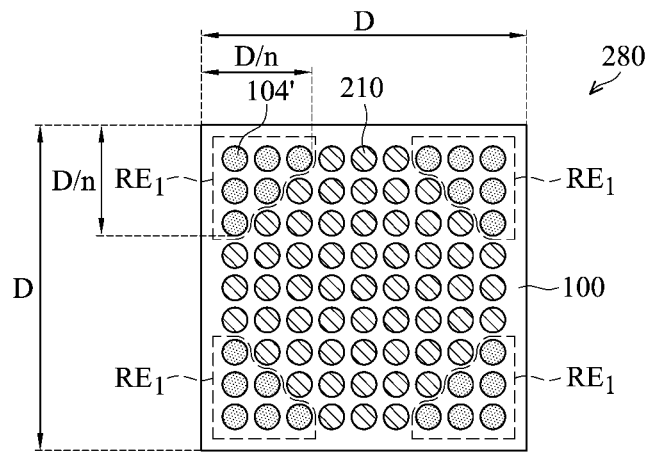
FIGS. 7A-7D are top views showing various arrangements of pillar bumps and elongated solder bumps of bonding structures, in accordance with some embodiments.

In some embodiments, elongated solder bumps 104' and pillar bumps 210 are formed on different regions of semiconductor die 100. As shown in FIG. 7A, elongated solder bumps 104' are formed on corner regions $RE_1$ of semiconductor die 100. Pillar bumps 210 are formed on the remaining region of semiconductor die 100 to assist in the formation of elongated solder bumps 104'. In some embodiments, after a thermal cycling, corner regions $RE_1$ suffer from higher stress than the remaining regions due to mismatch of the CTE of semiconductor die 100 and the substrate after reflow. The formation of elongated solder bumps 104' on corner regions $RE_1$ reduces bump cracking risk and improves reliability of package structure 280. In some embodiments, a side of semiconductor die 100 has a width D. Each of corner regions $RE_1$ has a smaller width which is equal to D/n, and n is a number, which is in a range from about 3 to about 8.

Figure 7B:
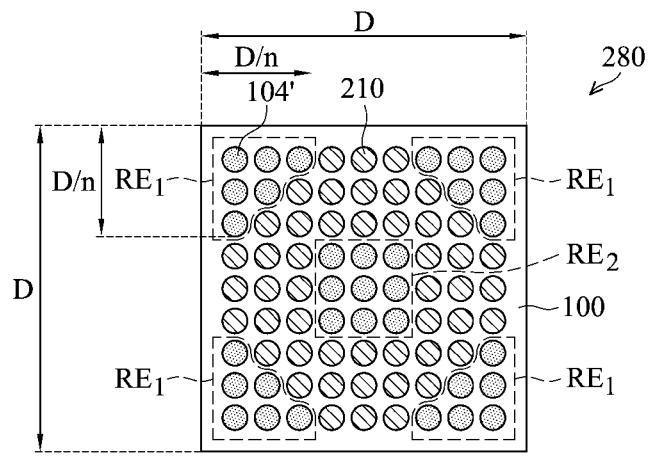

As shown in FIG. 7B, elongated solder bumps 104' may also be formed on a central portion $RE_2$ of semiconductor die 100. The formation of elongated solder bumps 104' on central portion $RE_2$ provides support when package structure 280 drops from height or suffers from collision.

Figure 7C:
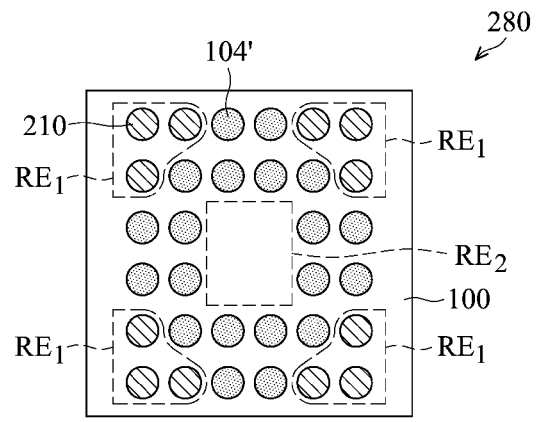
Figure 7D:
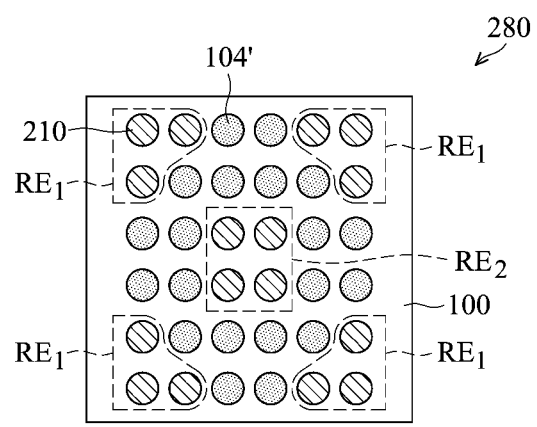

It should be appreciated that the arrangements of elongated solder bumps 104' and pillar bumps 210 are not limited to those shown in FIGS. 7A and 7B. For example, other arrangements of elongated solder bumps 104' and conductive pillars 206 are shown in FIGS. 7C and 7D. As shown in FIG. 7C, in some embodiments, pillar bumps 210 are on corner regions $RE_1$. No solder bump or pillar bump formed on central region $RE_2$. Elongated solder bumps 104' are formed on the remaining region. Accordingly, additional buffer may be provided for the package structure. As shown in FIG. 7D, in some embodiments, pillar bumps 210 are formed on both corner regions RE₁ and central region RE₂ to meet other design requirements.

Figure 8:
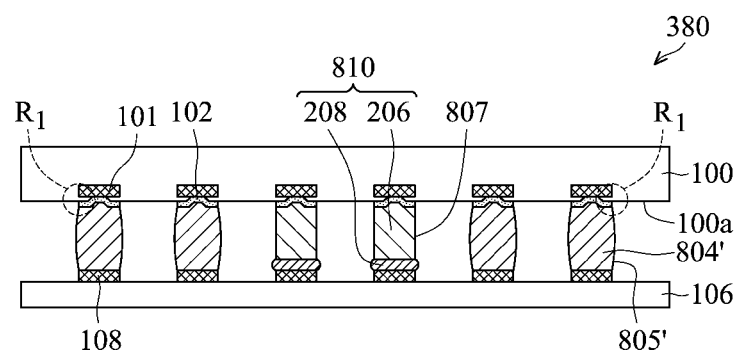
FIG. 8 shows a cross-sectional view of a package structure, in accordance with some embodiments.

FIG. 8 is a cross-sectional views a package structure 380, in accordance with some embodiments. Pillar bumps 810 are made of the same materials with pillar bumps 210 mentioned above. Pillar bumps 810 and elongated solder bumps 804' are directly formed on UBM layer 102. Therefore, the upper surfaces of pillar bumps 810 and elongated solder bumps 804' are not flat and are conformal with the shape of UBM layer 102.

Figure 9:
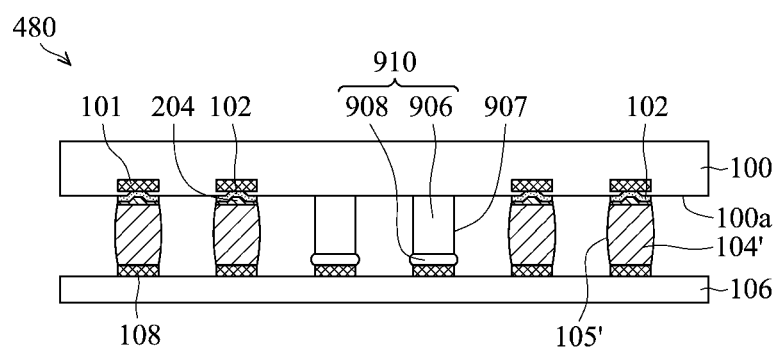
FIG. 9 shows a cross-sectional view of a package structure, in accordance with some embodiments.

FIG. 9 is a cross-sectional views a package structure 480, in accordance with some embodiments. As shown in FIG. 9, pillar bumps 910 other than pillar bumps 210 or 810 mentioned above are formed over semiconductor die 100. Pillar bumps 910 include pillars 906 and a bonding layer 908. Pillars 906 have sidewall surfaces 907. Sidewall surfaces 907 may be substantially perpendicular to main surface 100a of semiconductor die 100. Alternatively, sidewall surfaces 907 may not be perpendicular to main surface 100a of semiconductor die 100.

Pillars 906 may be made of an insulating material, semiconductor material, metal material, other suitable material, or combinations thereof. Pillars 906 have a melting point (or a softing point) higher than solders. In some embodiments, pillar bumps 910 are not formed over a UBM layer when they are not electrically connected to devices formed in semiconductor die 100. In some embodiments, bonding layer 908 is a solder layer or an adhesive layer. For example, bonding layer 908 may be an adhesive layer when pillars 906 are made of insulating materials or semiconductor materials. In some embodiments, the adhesive layer includes glues, resins, other applicable materials, solder paste, flux, or combinations thereof.

Embodiments of mechanisms for bonding a semiconductor die to a substrate are described. A distance between the semiconductor die and the substrate, during and after a reflow process, is sustained by pillars whose melting temperature is higher than solder. Due to the rigid pillars, solder bumps between the semiconductor die and the substrate are elongated after reflow. The elongated solder bumps have less stress at corner regions than regular solder bumps. As a result, cracking risk of the elongated solder bumps is significantly reduced, and the reliability of the package structure is greatly improved. The hybrid bonding structures between the semiconductor die and the substrate include hybrid mixture of pillar bumps and elongated solder bumps.

In accordance with some embodiments, a package structure is provided. The package structure includes a semiconductor die and a substrate. The package structure includes a pillar bump and an elongated solder bump bonded to the semiconductor die and the substrate. A height of the elongated solder bump is substantially equal to a height of the pillar bump. The elongated solder bump has a first width, at a first horizontal plane passing through an upper end of a sidewall surface of the elongated solder bump, and a second width, at a second horizontal plane passing through a midpoint of the sidewall surface. A ratio of the second width to the first width is in a range from about 0.5 to about 1.1.

In accordance with some embodiments, a package structure is provided. The package structure includes a semiconductor die and a substrate. The package structure also includes a plurality of pillar bumps and a plurality elongated solder bumps bonded to the semiconductor die and the substrate. A height of each of the elongated solder bumps is substantially equal to a height of each of the pillars. Each of the elongated solder bumps has a first width, at a first horizontal plane passing through an upper end of a sidewall surface of the elongated solder bump, and a second width, at a second horizontal plane passing through a midpoint of the sidewall surface. A ratio of the second width to the first width is in a range from about 0.5 to about 1.1.

In accordance with some embodiments, a method for forming a package structure is provided. The method includes providing a semiconductor die and forming a pillar and a solder ball over the semiconductor die. The pillar has a melting point higher than that of the solder ball. The method also includes bonding the pillar and the solder ball to a substrate through a reflow process with forming a pillar bump and an elongated solder bump. A height of the elongated solder bump is substantially equal to a height of the pillar bump. The elongated solder bump has a first width, at a first horizontal plane passing through an upper end of a sidewall surface of the elongated solder bump, and a second width, at a second horizontal plane passing through a midpoint of the sidewall surface. A ratio of the second width to the first width is in a range from about 0.5 to about 1.1.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure, comprising:
 a first substrate;
 a second substrate;
 a pillar bump bonded to the first substrate and the second substrate, the pillar bump being electrically coupled to the first substrate and the second substrate, wherein the pillar bump comprises a pillar and a bonding layer, the pillar is a non-solder material having a higher reflow temperature than the bonding layer, the bonding layer is between the pillar and the second substrate, and the pillar includes a linear sidewall profile; and
 an elongated solder bump bonded to the first substrate and the second substrate, wherein a height of the elongated solder bump is substantially equal to a height of the pillar bump, wherein the elongated solder bump and the bonding layer are formed of a solder, wherein the pillar bump and the elongated solder bump are positioned equidistant from a same sidewall of the first substrate in a plan view.

2. The package structure of claim 1, wherein the first substrate comprises a semiconductor die.

3. The package structure of claim 2, wherein the bonding layer is interposed between the pillar and the second substrate.

4. The package structure of claim 1, wherein the elongated solder bump has convex sidewalls.

5. The package structure of claim 1, wherein the elongated solder bump has a solder portion having a first width at a first horizontal plane passing through an upper end of a sidewall surface of the elongated solder bump, and the solder portion has a second width at a second horizontal plane passing through a midpoint of the sidewall surface of the elongated solder bump, and wherein a ratio of the second width to the first width is in a range from 0.5 to 1.1.

6. The package structure of claim 1, wherein the pillar consists of a metal material selected from a group consisting of copper, gold, platinum, titanium, nickel, aluminum, and a combination thereof.

7. The package structure of claim 1, wherein the first substrate comprises an underbump metallization structure, the pillar extending from the underbump metallization structure.

8. A package structure, comprising:
a first substrate having a first contact pad and a second contact pad;
a second substrate having a third contact pad and a fourth contact pad;
a first connection extending from the first contact pad to the third contact pad, wherein the first connection comprises a pillar and a bonding layer, the pillar and the bonding layer being formed of different materials; and
a second connection extending from the second contact pad to the fourth contact pad, wherein the second connection and the bonding layer are formed of a solder having a lower reflow temperature than a non-solder material of the pillar, wherein the first contact pad connected to the pillar and the second contact pad connected to the solder have a similar shape in a plan view.

9. The package structure of claim 8, wherein the first connection is interposed between the second connection and a third connection, the third connection having a same structure as the second connection and a different structure than the first connection in the plan view.

10. The package structure of claim 9, wherein the second connection is positioned in a corner of the first substrate and the third connection is positioned in a central region of the first substrate in the plan view.

11. The package structure of claim 8, wherein the second connection is closer to a corner of the first substrate than the first connection in the plan view.

12. The package structure of claim 8, wherein the first connection electrically couples the first substrate to the second substrate.

13. The package structure of claim 8, wherein the pillar consists of a metal material selected from a group consisting of copper, gold, platinum, titanium, nickel, aluminum, and a combination thereof.

14. The package structure of claim 13, wherein the second connection has a first portion having a first width at a first horizontal plane passing through an upper end of a sidewall surface of the second connection, wherein the second connection has a second width at a second horizontal plane passing through a midpoint of the sidewall surface, and wherein a ratio of the second width to the first width is in a range from 0.5 to 1.1.

15. A package structure, comprising:
a semiconductor die having a first contact pad and a second contact pad;
a substrate having a third contact pad and a fourth contact pad; and
a plurality of connections coupling the semiconductor die to the substrate, the plurality of connections comprising a first connection and a second connection, the first connection coupling the first contact pad and the third contact pad, wherein the first connection comprises a pillar and a first solder layer, the pillar being a non-solder material, the second connection coupling the second contact pad and the fourth contact pad, wherein the second connection has a lower reflow temperature than the non-solder material of the pillar, wherein a region between the second connection and a nearest edge of the semiconductor die to the second connection is free of all other connections of the plurality of connections in a plan view.

16. The package structure of claim 15, wherein the first contact pad comprises an underbump metallization.

17. The package structure of claim 15, wherein the second connection has concave sidewalls.

18. The package structure of claim 15, wherein the second connection has convex sidewalls.

19. The package structure of claim 15, wherein the first connection and the second connection electrically couple the semiconductor die to the substrate.

20. The package structure of claim 15, wherein the pillar remains rigid during reflow of the second connection.

* * * * *